United States Patent
Berggren et al.

(10) Patent No.: US 10,514,429 B2
(45) Date of Patent: Dec. 24, 2019

(54) SQUID ARRAY PLANAR AND AXIAL GRADIOMETER

(71) Applicant: United States of America as represented by the Secretary of the Navy, San Diego, CA (US)

(72) Inventors: Susan Anne Elizabeth Berggren, San Diego, CA (US); Robert Lewis Fagaly, Carlsbad, CA (US); Anna Leese de Escobar, Encinitas, CA (US); Marcio de Andrade, San Diego, CA (US); Benjamin Jeremy Taylor, Escondido, CA (US)

(73) Assignee: United States of America as represented by the Secretary of the Navy, Washington, DC (US)

( * ) Notice: Subject to any disclaimer, the term of this patent is extended or adjusted under 35 U.S.C. 154(b) by 58 days.

(21) Appl. No.: 15/970,134

(22) Filed: May 3, 2018

(65) Prior Publication Data
US 2019/0339339 A1 Nov. 7, 2019

(51) Int. Cl.
*G01R 33/02* (2006.01)
*G01R 33/035* (2006.01)
(Continued)

(52) U.S. Cl.
CPC ......... *G01R 33/0354* (2013.01); *G01R 15/18* (2013.01); *G01R 33/02* (2013.01);
(Continued)

(58) Field of Classification Search
CPC ............. G01R 33/0354; G01R 33/035; G01R 33/0356; G01R 33/0358; G01R 33/02;
(Continued)

(56) References Cited

U.S. PATENT DOCUMENTS

| 4,280,095 A | 7/1981 | Hinton |
| 4,437,064 A | 3/1984 | Overton, Jr. et al. |

(Continued)

OTHER PUBLICATIONS

J. Vrba; "Multichannel SQUID Biomagnetic Systems"; In: Weinstock H. (eds) Applications of Superconductivity. NATO ASI Series (Series E: Applied Sciences), vol. 365. Springer, Dordrecht (2000).
(Continued)

*Primary Examiner* — Raul J Rios Russo
(74) *Attorney, Agent, or Firm* — Naval Information Warfare Center Pacific; Kyle Eppele; J. Eric Anderson

(57) ABSTRACT

An intrinsic superconducting gradiometer comprising: a first array having at least two superconducting devices, wherein the first array has upper and lower terminals located on opposite sides of the first array, wherein the upper terminal is configured to receive a bias signal; and a second array that is identical to, oriented the same as, and located in close proximity to the first array, wherein the second array's upper terminal is grounded and its lower terminal is electrically connected to the first array's lower terminal such that a measured voltage difference between the first array's upper terminal and the second array's upper terminal represents a net current generated by a gradient magnetic field where near-field measurements are cancelled, and wherein the intrinsic superconducting gradiometer is designed to provide the measured voltage difference that is directly proportional to the magnetic field gradient without being connected to any external coils or flux transducers.

19 Claims, 5 Drawing Sheets

(51) Int. Cl.
*G01R 15/18* (2006.01)
*G01R 33/022* (2006.01)

(52) U.S. Cl.
CPC ......... *G01R 33/022* (2013.01); *G01R 33/035* (2013.01); *G01R 33/0356* (2013.01); *G01R 33/0358* (2013.01); *Y10S 248/901* (2013.01); *Y10S 505/845* (2013.01); *Y10S 505/846* (2013.01)

(58) Field of Classification Search
CPC ............. Y10S 505/846; Y10S 505/845; Y10S 248/901
USPC ............ 324/51, 55, 200, 227, 228, 244, 248
See application file for complete search history.

(56) References Cited

U.S. PATENT DOCUMENTS

| | | |
|---|---|---|
| 5,122,744 A | 6/1992 | Koch |
| 5,900,730 A | 5/1999 | Kim et al. |
| 2008/0001599 A1* | 1/2008 | Wu ............... G01R 33/028 324/248 |
| 2011/0285393 A1* | 11/2011 | Zakosarenko ....... G01R 33/035 324/248 |
| 2018/0164385 A1* | 6/2018 | Chesca .............. G01R 33/0354 |

OTHER PUBLICATIONS

P. Carelli et al. "A planar second-order DC SQUID gradiometer"; Clin. Phys. Physiol. Meas. 1991.
R. L. Fagaly; "SQUID Instruments and Applications", Review of Scientific Instruments Preprint, 2005.
Michelle A. Espy; "Two Methods for a First Order Hardware Gradiometer Using Two HTS SQUIDS"; Proceedings for the Applied Superconductivity Conference, Palm Desert, CA, Sep. 13-18, 1998.
Fagaly; "Superconducting Quantum Interference Devices (SQUIDS)"; J. Webster (ed.), Wiley Encyclopedia of Electrical and Electronics Engineering.; John Wiley & Sons, Inc.; 2016.
R. H. Koch et al.; "Three SQUID gradiometer"; Appl. Phys. Lett. 63, 403; American Institute of Physics; (1993).
R. L. Fagaly; "Superconducting quantum interference device instruments and applications"; Review of Scientific Instruments 77; (2006).
Robin Cantor et al.; "Thin-Film Planar Gradiometer with Long Baseline"; J. Phys.: Conf. Ser. 43 1223; (2006).
Slawomir Tumanski; "Induction Coil Sensors—A Review"; IOP Publishing Ltd; Measurement Science and Technology, vol. 18, No. 3; (2007).

* cited by examiner

US 10,514,429 B2

SQUID ARRAY PLANAR AND AXIAL GRADIOMETER

FEDERALLY-SPONSORED RESEARCH AND DEVELOPMENT

The United States Government has ownership rights in this invention. Licensing and technical inquiries may be directed to the Office of Research and Technical Applications, Space and Naval Warfare Systems Center, Pacific, Code 72120, San Diego, Calif., 92152; voice (619) 553-5118; ssc_pac_t2@navy.mil. Reference Navy Case Number 103699.

BACKGROUND OF THE INVENTION

Superconducting Quantum Interference Devices (SQUIDs) are comprised of tiny loops of superconducting material in which Josephson junctions are placed in the loop path. A Josephson junction is a region of material that provides a weak link between two fully superconducting regions. The DC SQUID has two symmetrical Josephson junctions. They are able to sense extremely small magnetic fields. Non-uniforms arrays of DC SQUIDs and DC bi-SQUIDs, which are DC SQUIDs with an additional Josephson junction bisecting the superconducting loop, have been modeled in different array designs and coupling schemes to determine their linearity and sensing capacities and have been fabricated in low temperature superconducting materials. A SQUID-based sensor detects minute magnetic fields and is decoupled from the size of the signals wavelength. Hence the device can sense signals in the DC-GHz range, but still be contained fully on a ~1×1 cm chip.

While it is possible to electronically subtract the (voltage) outputs of SQUID (and by inference SQUID Array) magnetometers (aka an extrinsic gradiometer), there are limitations due to dynamic range, mismatches in gain, etc. that limit the efficacy of these techniques. There is a need for an improved gradiometer.

SUMMARY

Disclosed herein is an intrinsic superconducting gradiometer comprising a first and a second array. The first array has at least two superconducting devices. The first array has upper and lower terminals located on opposite sides of the first array. The upper terminal is configured to receive a bias signal. The second array is identical to, oriented the same as, and located in close proximity to the first array. The second array's upper terminal is grounded and its lower terminal is electrically connected to the first array's lower terminal such that a measured voltage difference between the first array's upper terminal and the second array's upper terminal represents a net current generated by a gradient magnetic field where near-field measurements are cancelled. The intrinsic superconducting gradiometer is designed to provide the measured voltage difference that is directly proportional to the magnetic field gradient without being connected to any external coils or flux transducers.

An embodiment of the intrinsic superconducting gradiometer may be described as a quantum interference device (SQUID) gradiometer comprising first and second SQUID arrays. The first SQUID array comprises at least two SQUIDs. The first SQUID array has upper and lower terminals located on opposite sides of the first SQUID array, and the upper terminal is configured to receive a bias signal. The second SQUID array is identical to, oriented the same as, and located in close proximity to the first SQUID array. The second SQUID array's upper terminal is grounded and its lower terminal is electrically connected to the first SQUID array's lower terminal such that a measured voltage difference between the first SQUID array's upper terminal and the second SQUID array's upper terminal represents a net current generated by a gradient magnetic field where near-field measurements are cancelled. The intrinsic SQUID gradiometer is designed to provide the measured voltage difference that is directly proportional to the magnetic field gradient without being connected to any external coils or flux transducers.

An embodiment of the intrinsic superconducting gradiometer may be described as comprising a first and second array. The first array has at least two superconducting devices. The first array has upper and lower terminals located on opposite sides of the first array. The upper terminal is configured to receive a bias signal, and each superconducting device comprises at least one Josephson junction loop and is configured to function as a magnetic-to-voltage transducer. The second array is identical to, oriented the same as, and located in close proximity to the first array. The second array's upper terminal is grounded and its lower terminal is electrically connected to the first array's lower terminal such that a measured voltage difference between the first array's upper terminal and the second array's upper terminal represents a net current generated by a gradient magnetic field where near-field measurements are cancelled. The intrinsic superconducting gradiometer is designed to provide the measured voltage difference that is directly proportional to the magnetic field gradient without being connected to any external coils or flux transducers.

BRIEF DESCRIPTION OF THE DRAWINGS

Throughout the several views, like elements are referenced using like references. The elements in the figures are not drawn to scale and some dimensions are exaggerated for clarity.

DETAILED DESCRIPTION OF EMBODIMENTS

The disclosed apparatus below may be described generally, as well as in terms of specific examples and/or specific embodiments. For instances where references are made to detailed examples and/or embodiments, it should be appreciated that any of the underlying principles described are not to be limited to a single embodiment, but may be expanded for use with any of the other methods and systems described herein as will be understood by one of ordinary skill in the art unless otherwise stated specifically.

Figure 1:
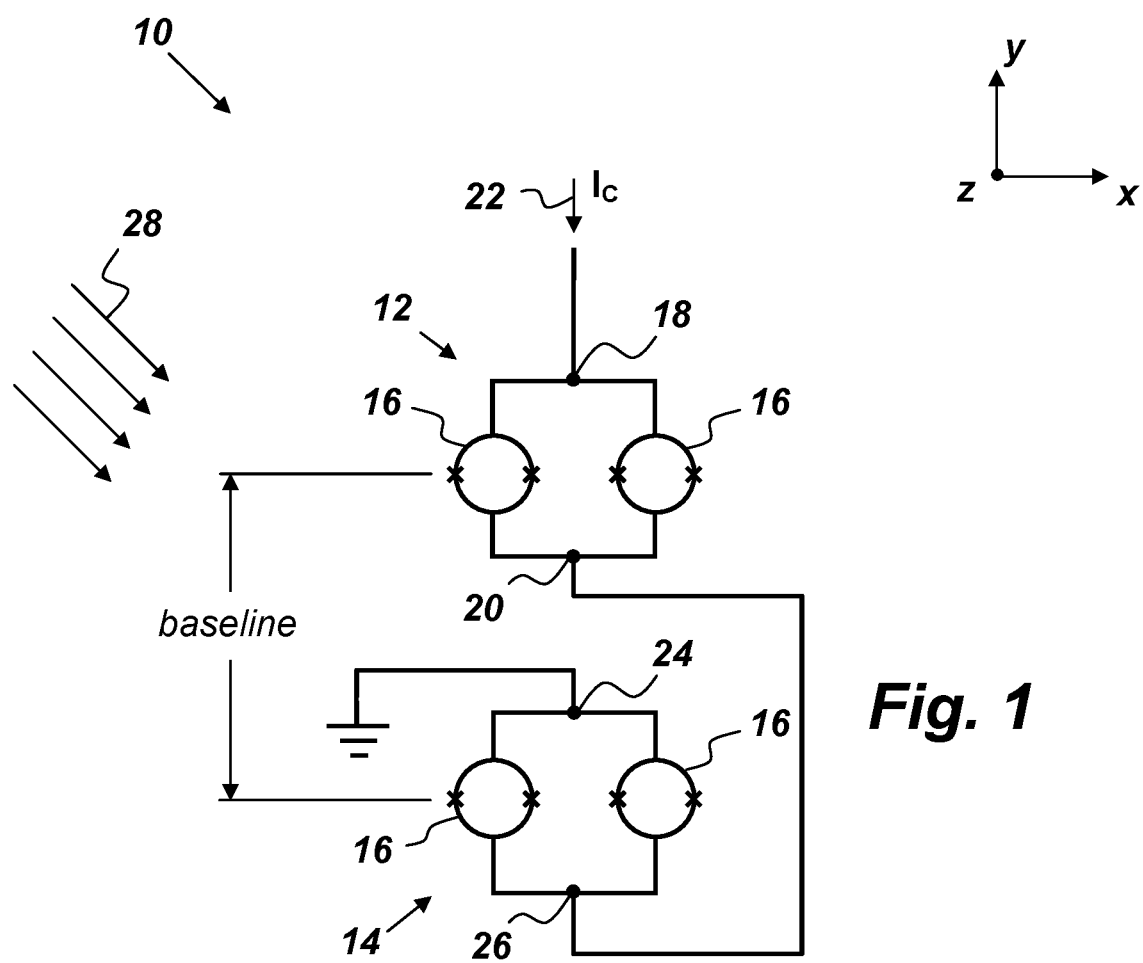
FIG. 1 is an illustration of a planar embodiment of an intrinsic superconducting gradiometer.

FIG. 1 is an illustration of an intrinsic superconducting gradiometer 10 that comprises, consists of, or consists essentially of first and second arrays 12 and 14 respectively of superconducting devices 16. The first array 12 comprises at least two superconducting devices 16 and has upper and lower terminals 18 and 20 located on opposite sides of the first array 12. The upper terminal 18 is configured to receive a bias signal 22. The second array 14 is identical to, oriented the same as, and located in close proximity to the first array 12. As used herein, the term "in close proximity to" means within approximately 10 cm of each other.

Also, as used herein, the term "identical to", means that both arrays have the same voltage output in response to a magnetic field input, i.e., identical dV/dB values. It is possible for two arrays to be physically different, i.e., have different layout, different number of superconducting devices 16 (such as SQUID elements), made using different Josephson junction (JJ) technologies (e.g. step-edge JJ, ion-damage JJ, ramp edge JJ, etc.), and still be considered "identical", as that term is used herein. Due to the limits of fabrication it is likely that two physically identical SQUID arrays will have similar, but not identical optimal values for dV/dB. The values of dV/dB can be made identical by adjusting the bias currents of one or both to make them equal (identical). Specifically, dV/dB is a function of circuit bias current (and also temperature).

Figure 2:
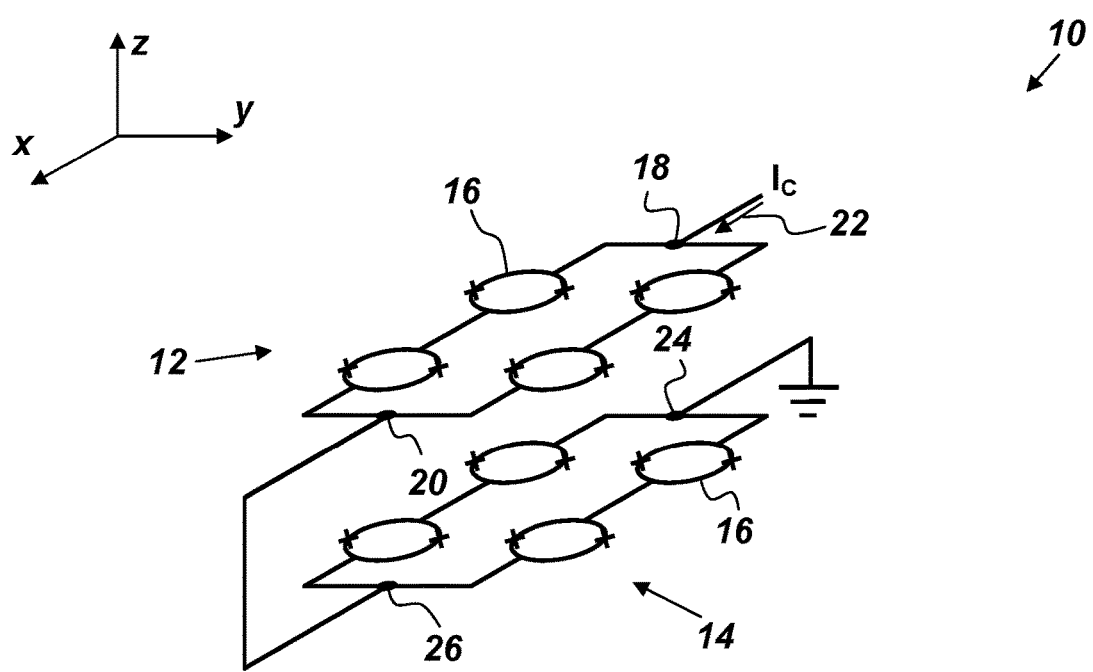
FIG. 2 is an illustration of an axial embodiment of an intrinsic superconducting gradiometer.

The first and second arrays 12 and 14 may be next to each other in the same plane (such as is shown in FIG. 1) or above/below each other in different planes (such as is shown in FIG. 2). The second array 14 has an upper terminal 24 that is grounded and a lower terminal 26 that is electrically connected to the lower terminal 18 of the first array 12 such that a measured voltage difference between the first array's upper terminal 18 and the second array's upper terminal 24 represents a net current generated by a gradient magnetic field 28 where near-field measurements are cancelled. In this embodiment, the first and second arrays 12 and 14 are disposed within an x-y plane of an x-y-z mutually orthogonal coordinate plane to form n planar gradiometer. The superconducting devices 16 of the gradiometer 10 may be directly exposed to ambient magnetic fields without any shielding.

The gradiometer 10 is designed to provide the measured voltage difference that is directly proportional to the magnetic field gradient without being connected to any external coils or flux transducers, such as pick up loops or coils that amplify the external signals (e.g., the magnetic field 28) into the superconducting devices 16. In the embodiment of the gradiometer 10 shown in FIG. 1, the superconducting devices 16 are superconducting quantum interference devices (SQUIDs), but it is to be understood that the superconducting devices may alternatively be, but are not limited to, bi-SQUIDs, or other devices that comprise at least one Josephson junction loop and are configured to function as a magnetic-to-voltage transducer. In some embodiments, the arrays of superconducting devices may be superconducting quantum interference filters (SQIFs). Also in the embodiment of the gradiometer 10 shown in FIG. 1, the two arrays are planar array arranged in the same x-y plane. This position and orientation allows the embodiment of the gradiometer 10 shown in FIG. 1 to measure the magnetic field gradient in the y-direction. Note that gradiometer 10 does not require external coils or flux transformers to operate.

The individual superconducting devices 16 in the SQUID arrays, or SQIFs, may be connected together in series, in parallel, or series-parallel or series opposition. The superconducting devices 16 of the first array 12 depicted in FIG. 2 are shown in a series opposition configuration. The gradiometer 10 may be used for a number of different purposes including, but not limited to, magnetic anomaly detection (MAD) and reducing external (i.e., distant) noise sources when measuring magnetic signatures such as is performed in magnetocardiography, magnetoencephalography, and magnetic microscopy. Fields where the gradiometer 10 may be useful include, but are not limited to, geophysics (e.g., transient electromagnetics (TEM) for oil and mineral exploration), medicine (biomagnetism) and non-destructive testing (e.g., magnetic microscopy). To date, commercial applications of SQUID devices have focused on sub-10 kHz frequencies. The gradiometer 10 has the ability to move capabilities into the MHz (and higher) regimes. One potential application would be the detection of the radio frequency (RF) signals in magnetic resonance imaging (MRI). Another is the area of radio astronomy.

In consequence of the orientation, placement, and manner of coupling, the gradiometer 10 produces a net current seen by the Josephson loops generated by a magnetic field gradient. For example, in the embodiment of the gradiometer 10 shown in FIG. 1, the voltage difference between the first array's upper terminal 18 and the second array's upper terminal 24 represents a net current generated by the gradient magnetic field that is much greater in terms of sensitivity and linearity than the difference of two much larger (extrinsic magnetometer-induced) currents such as is done in the prior art.

Knowledge of the total magnetic field gradient (VB) of an object can allow determination of its magnitude and direction. In terms of magnetic anomaly detection (MAD), different embodiments of the gradiometer 10 can be used as either a 3-axis (Bx, By, Bz) sensor or an 8-element tensor array (Bx, By, Bz; dBx/dx, dBy/dy, dBx/dy, dBx/dz, dBy/dz). The gradiometer 10 has the potential to increase sensitivities by two orders of magnitude over current technology that uses discrete SQUID sensors. Embodiments of the gradiometer 10 with cm (or larger) baselines can lead to significant improvements in MAD capabilities. The baseline is the distance between the first and second arrays. In one embodiment, the gradiometer 10 has a baseline greater than one-half of a largest dimension of the first array 12 (such as the distance between individual superconducting devices 16 and no more than approximately 10 cm.

FIG. 2 is an illustration of an axial embodiment of the gradiometer 10. In this embodiment of the gradiometer 10, the first array 12 and the second array 14 each comprise four superconducting devices 16, which in this case are SQUIDs connected together in series opposition with respect to each other. In this embodiment, the first array 12 is disposed in a first x-y plane of an x-y-z mutually orthogonal coordinate plane, and the second array 14 is disposed directly below the first array 12 in a second x-y plane that is parallel to the first x-y plane to form an axial gradiometer. This position and orientation allows the embodiment of the gradiometer 10 shown in FIG. 2 to measure the magnetic field gradient in the z-direction.

Figure 3:
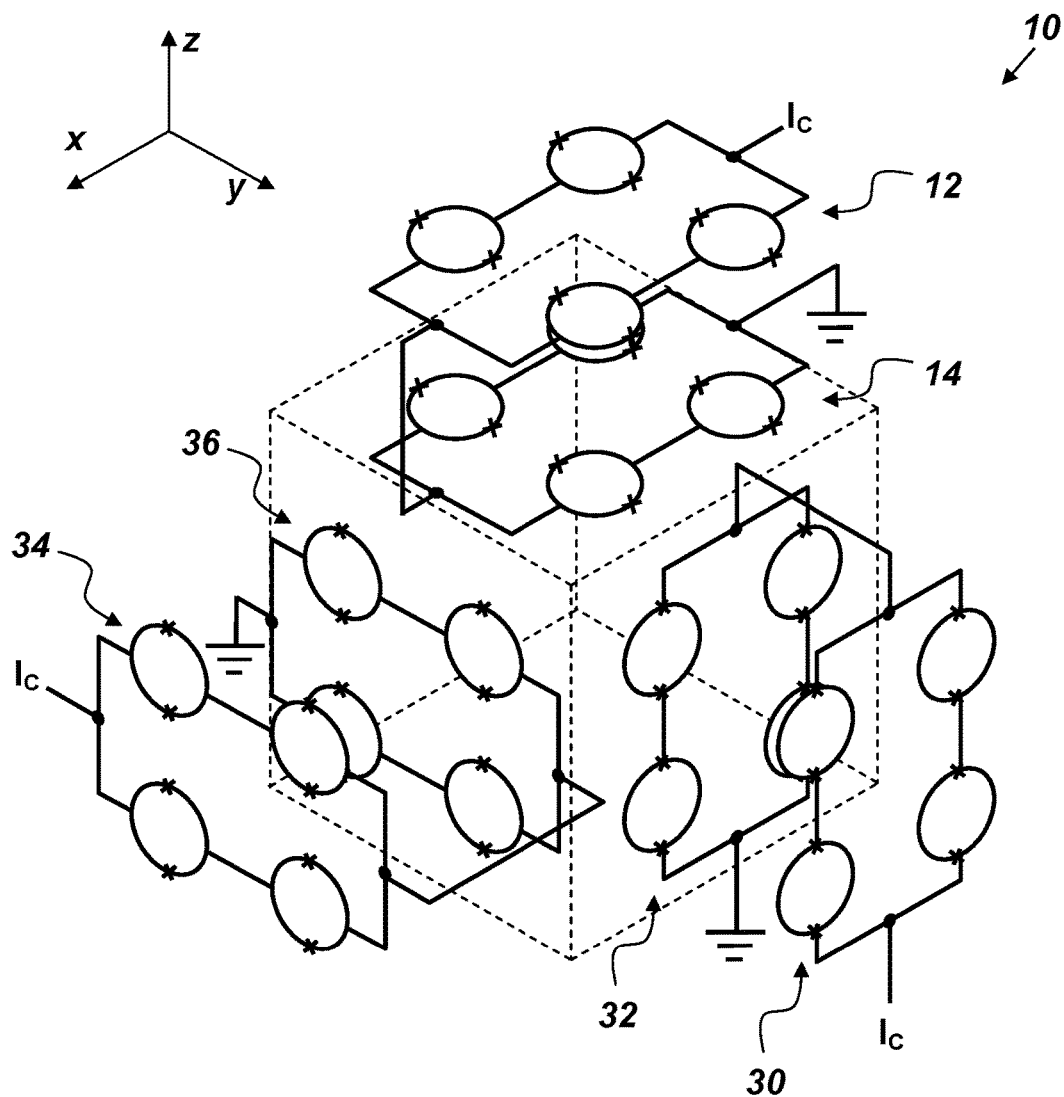
FIG. 3 is an illustration of a three-axis sensor embodiment of an intrinsic superconducting gradiometer.

FIG. 3 is an illustration of a three axis, axial sensor embodiment of the gradiometer 10 that, in addition to the first and second arrays 12 and 14, comprises a third array 30, a fourth array 32, a fifth array 34, and a sixth array 36, all of which are identical to the first array 12. In this embodiment, the third and fourth arrays 30 and 32 are coupled together and oriented with respect to each other in the same manner as the axial gradiometer embodiment of the first and second arrays 12 and 14 depicted in FIG. 2. In the embodiment of the gradiometer 10 shown in FIG. 3, the third and fourth arrays 30 and 32 are disposed in separate, parallel x-z planes for measuring the magnetic field gradient in the y-direction. The fifth and sixth arrays 34 and 36, in this embodiment, are coupled together in the same manner as the axial gradiometer embodiment of the first and second arrays 12 and 14 depicted in FIG. 2. In the embodiment of the gradiometer 10 shown in FIG. 3, the fifth and sixth arrays 34 and 36 are disposed in separate, parallel y-z planes for measuring the magnetic field gradient in the x-direction.

Figure 4:
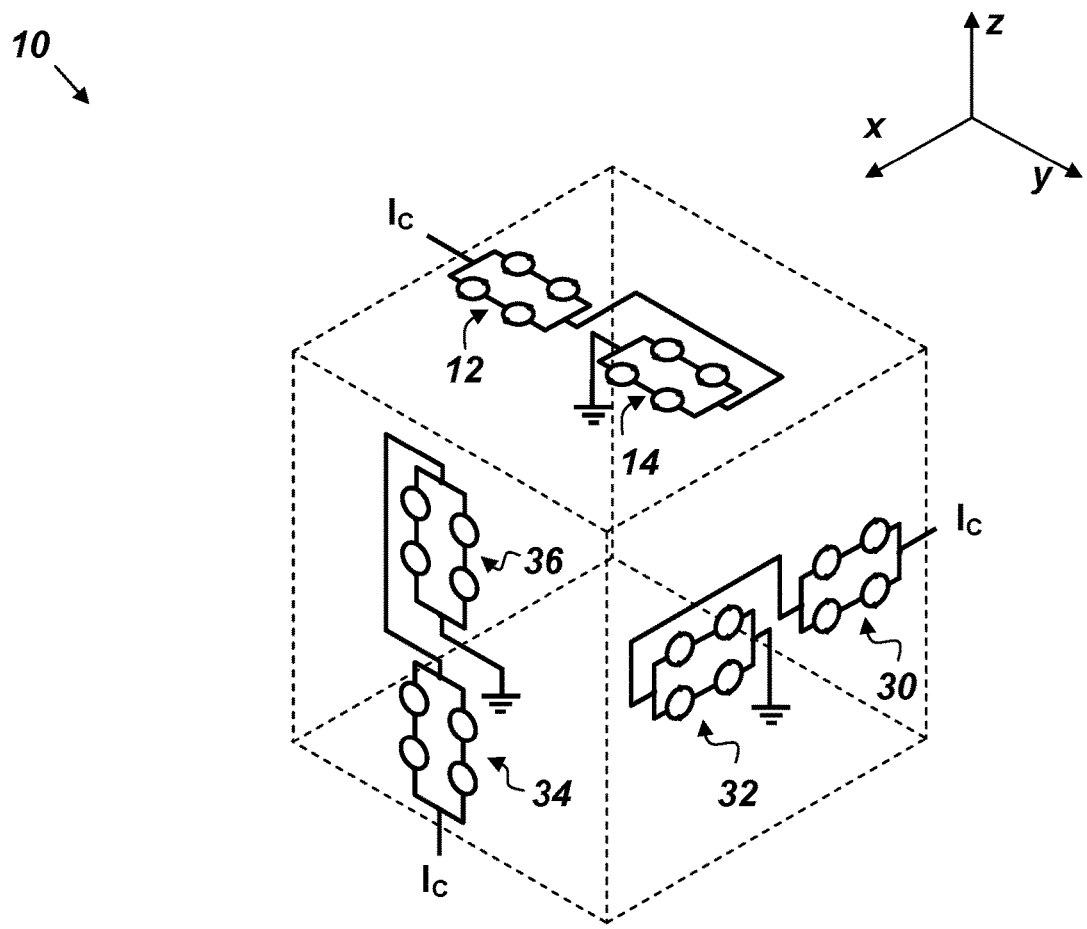
FIG. 4 is an illustration of a three-axis sensor embodiment of an intrinsic superconducting gradiometer.

FIG. 4 is an illustration of a three axis, planar sensor embodiment of the gradiometer 10 that also comprises the third array 30, the fourth array 32, the fifth array 34, and the sixth array 36 in addition to the first and second arrays 12 and 14. In this embodiment, each of the arrays is an array of four SQUIDs coupled together in series opposition. Here, the first and second arrays 12 and 14 are both disposed in the x-y plane and oriented so as to measure the magnetic field gradient in the y direction; and the third and fourth arrays 30 and 32 are coupled together and oriented with respect to each other in the same manner as the planar gradiometer embodiment of the first and second arrays 12 and 14 depicted in FIG. 1. In the embodiment of the gradiometer 10 shown in FIG. 4, the third and fourth arrays 30 and 32 are disposed in the x-z plane for measuring the magnetic field gradient in the x-direction, and the fifth and sixth arrays 34 and 36 are disposed in the y-z plane for measuring the magnetic field gradient in the z-direction. As shown, the fifth and sixth arrays 34 and 36 are coupled together in the same manner as the planar gradiometer embodiment of the first and second arrays 12 and 14 depicted in FIG. 1. While three axis, axial and planar sensor embodiments of the gradiometer 10 are shown in FIGS. 3 and 4 respectively, it is to be understood that the gradiometer 10 may have any desired combination of axial and planar arrays disposed on each axis.

Figure 5:
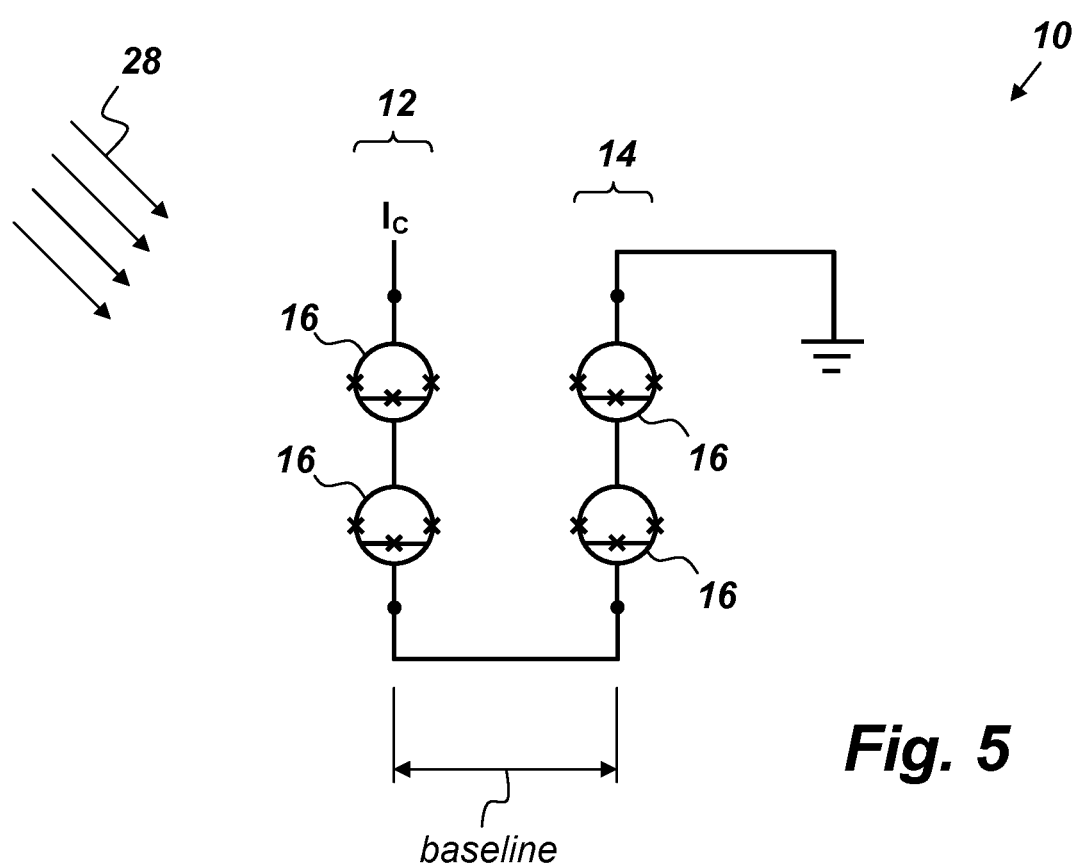
FIG. 5 is an illustration of a planar embodiment of an intrinsic superconducting gradiometer.

FIG. 5 is an illustration of another embodiment of the gradiometer 10 where the superconducting devices 16 are bi-SQUIDs. A standard dc SQUID, as are known in the art, can be modified by adding a nonlinear inductance in the form of a third Josephson junction such that the third Josephson junction is combined with the main inductance in the Josephson loop to act as a single junction SQUID. This type of superconducting device is known as a bi-SQUID. In the embodiment of the gradiometer 10 shown in FIG. 5, the bi-SQUIDs in each array are electrically connected in series.

From the above description of the gradiometer 10, it is manifest that various techniques may be used for implementing the concepts of gradiometer 10 without departing from the scope of the claims. The described embodiments are to be considered in all respects as illustrative and not restrictive. The method/apparatus disclosed herein may be practiced in the absence of any element that is not specifically claimed and/or disclosed herein. It should also be understood that gradiometer 10 is not limited to the particular embodiments described herein, but is capable of many embodiments without departing from the scope of the claims.

We claim:

1. An intrinsic superconducting gradiometer comprising:
   a first array having at least two superconducting devices, wherein the first array has upper and lower terminals located on opposite sides of the first array, wherein the upper terminal is configured to receive a bias signal; and
   a second array that is identical to, oriented the same as, and located in close proximity to the first array, wherein the second array's upper terminal is grounded and its lower terminal is electrically connected to the first array's lower terminal such that a measured voltage difference between the first array's upper terminal and the second array's upper terminal represents a net current generated by a gradient magnetic field where near-field measurements are cancelled, and wherein the intrinsic superconducting gradiometer is designed to provide the measured voltage difference that is directly proportional to the magnetic field gradient without being connected to any external coils or flux transducers.

2. The intrinsic superconducting gradiometer of claim 1, wherein the superconducting devices are superconducting quantum interference devices (SQUIDs).

3. The intrinsic superconducting gradiometer of claim 1, wherein the superconducting devices are bi-SQUIDs.

4. The intrinsic superconducting gradiometer of claim 2, wherein the first and second arrays are superconducting quantum interference filters (SQIFs).

5. The intrinsic superconducting gradiometer of claim 1, wherein each superconducting device comprises a Josephson junction.

6. An intrinsic superconducting quantum interference device (SQUID) gradiometer comprising:
   a first SQUID array having at least two SQUIDs, wherein the first SQUID array has upper and lower terminals located on opposite sides of the first SQUID array, wherein the upper terminal is configured to receive a bias signal; and
   a second SQUID array that is identical to, oriented the same as, and located in close proximity to the first SQUID array, wherein the second SQUID array's upper terminal is grounded and its lower terminal is electrically connected to the first SQUID array's lower terminal such that a measured voltage difference between the first SQUID array's upper terminal and the second SQUID array's upper terminal represents a net current generated by a gradient magnetic field where near-field measurements are cancelled, and wherein the intrinsic SQUID gradiometer is designed to provide the measured voltage difference that is directly proportional to the magnetic field gradient without being connected to any external coils or flux transducers.

7. The intrinsic SQUID gradiometer of claim 6, wherein the first and second SQUID arrays are disposed within an x-y plane of an x-y-z mutually orthogonal coordinate plane to form a planar gradiometer.

8. The intrinsic SQUID gradiometer of claim 7, further comprising third and fourth SQUID arrays that are identical to the first and second SQUID arrays but wherein the third and fourth SQUID arrays are disposed in an x-z plane.

9. The intrinsic SQUID gradiometer of claim 8, further comprising fifth and sixth SQUID arrays that are identical to the first and second SQUID arrays but wherein the fifth and sixth SQUID arrays are disposed in a y-z plane.

10. The intrinsic SQUID gradiometer of claim 6, wherein the first SQUID array is disposed in a first plane and the second SQUID array is disposed directly below the first SQUID array in a second plane that is parallel to the first plane to form an axial gradiometer.

11. The intrinsic SQUID gradiometer of claim 10, further comprising third and fourth SQUID arrays that are identical to the first and second SQUID arrays but wherein the third and fourth SQUID arrays are disposed in parallel planes that are orthogonal to the planes in which the first and second SQUID arrays are disposed.

12. The intrinsic SQUID gradiometer of claim 11, further comprising fifth and sixth SQUID arrays that are identical to the first and second SQUID arrays but wherein the fifth and sixth SQUID arrays are disposed in parallel planes that are orthogonal to the planes in which the first and second SQUID arrays are disposed and orthogonal to the planes in which the third and fourth SQUID arrays are disposed.

13. The intrinsic SQUID gradiometer of claim 6, wherein the first and second SQUID arrays are superconducting quantum interference filters (SQIFs).

14. The intrinsic SQUID gradiometer of claim 6, wherein the first and second SQUID arrays are not shielded from ambient magnetic fields.

15. The intrinsic SQUID gradiometer of claim 6, wherein the first array consists of four SQUIDs electrically connected in series opposition to each other.

16. The intrinsic SQUID gradiometer of claim 6, wherein the individual SQUIDs of the first SQUID array are electrically connected in parallel to each other.

17. The intrinsic SQUID gradiometer of claim 6, wherein the individual SQUIDs of the first SQUID array are electrically connected in series to each other.

18. The intrinsic SQUID gradiometer of claim 6, wherein the intrinsic SQUID gradiometer has a baseline greater than one-half of a largest dimension of the first SQUID array.

19. An intrinsic superconducting gradiometer comprising:
a first array having at least two superconducting devices, wherein the first array has upper and lower terminals located on opposite sides of the first array, wherein the upper terminal is configured to receive a bias signal, and wherein each superconducting device comprises at least one Josephson junction loop and is configured to function as a magnetic-to-voltage transducer; and
a second array that is identical to, oriented the same as, and located in close proximity to the first array, wherein the second array's upper terminal is grounded and its lower terminal is electrically connected to the first array's lower terminal such that a measured voltage difference between the first array's upper terminal and the second array's upper terminal represents a net current generated by a gradient magnetic field where near-field measurements are cancelled, and wherein the intrinsic superconducting gradiometer is designed to provide the measured voltage difference that is directly proportional to the magnetic field gradient without being connected to any external coils or flux transducers.

* * * * *